(12) United States Patent
Liu

(10) Patent No.: US 7,837,363 B2
(45) Date of Patent: Nov. 23, 2010

(54) LED ILLUMINATING DEVICE AND LIGHT ENGINE THEREOF

(75) Inventor: Tay-Jian Liu, Taipei Hsien (TW)

(73) Assignee: Foxconn Technology Co., Ltd., Tu-Cheng, Taipei Hsien (TW)

( * ) Notice: Subject to any disclaimer, the term of this patent is extended or adjusted under 35 U.S.C. 154(b) by 114 days.

(21) Appl. No.: 12/274,338

(22) Filed: Nov. 19, 2008

(65) Prior Publication Data

US 2009/0268468 A1    Oct. 29, 2009

(30) Foreign Application Priority Data

Apr. 23, 2008  (CN) .................... 2008 1 0066780

(51) Int. Cl.
*B60Q 1/06* (2006.01)
(52) U.S. Cl. .................... 362/373; 362/294; 362/649
(58) Field of Classification Search ................ 362/373, 362/640, 646, 647, 649, 650, 294
See application file for complete search history.

(56) References Cited

U.S. PATENT DOCUMENTS

| 6,787,999 B2 * | 9/2004 | Stimac et al. ............... 315/51 |
| 6,974,233 B1 * | 12/2005 | Aubrey ....................... 362/294 |
| 7,144,140 B2 * | 12/2006 | Sun et al. ................... 362/373 |
| 2005/0174780 A1 * | 8/2005 | Park ........................... 362/294 |

* cited by examiner

*Primary Examiner*—Jong-Suk (James) Lee
*Assistant Examiner*—Julie A Shallenberger
(74) *Attorney, Agent, or Firm*—Frank R. Niranjan

(57) ABSTRACT

An LED illuminating device includes an optical section (10), an electrical section (30), and a heat dissipation section (20). The heat dissipation section is provided with a heat dissipation device (21) which includes a heat sink (22) and a cooling fan (23) provided over the heat sink. The heat sink includes a solid base (231) and a plurality of fins (222) extending radially and outwardly from the base. A blind hole (225) is axially provided in the base. A plurality of air passage holes (226) are radially defined through the base and communicate the blind hole with an outside of the base. The cooling fan provides an airflow towards the heat sink. A portion of the airflow flows through the blind hole and the air passage holes of the base.

13 Claims, 4 Drawing Sheets

LED ILLUMINATING DEVICE AND LIGHT ENGINE THEREOF

CROSS-REFERENCE TO RELATED APPLICATION

Relevant subject matter is disclosed in co-pending U.S. patent application Ser. No. 12/255,651 filed on Oct. 21, 2008 and entitled "LED ILLUMINATING DEVICE AND LIGHT ENGINE THEREOF". The co-pending U.S. patent application is assigned to the same assignee as the instant application. The disclosure of the above-identified co-pending application is incorporated herein by reference.

BACKGROUND

1. Technical Field

Embodiments of the present invention generally relate to light emitting diode (LED) illuminating devices, and particularly to an LED illuminating device with a high heat dissipating efficiency and a light engine of the LED illuminating device.

2. Description of Related Art

Presently, LEDs (light emitting diodes) are preferred for use in LED illuminating devices rather than CCFLs (cold cathode fluorescent lamps) due to a high brightness, a long lifespan, and a wide color range of the LED.

For an LED, eighty percents to ninety percents of the power consumed by the LED is converted into thermal energy, and only ten percents to twenty percents of the power consumed by the LED is converted into light. In addition, a plurality of LEDs are generally packaged in a single LED illuminating device in order to obtain a desirable illumination brightness. Therefore, heat dissipation of the LED illuminating device is a problem inhibiting the application of the LED illuminating device, which requires to be resolved.

For a high brightness LED illuminating device, a highly efficient heat dissipation device is necessary in order to timely and adequately remove the heat generated by the LED illuminating device. Otherwise, the brightness, lifespan, and reliability of the LED illuminating device will be seriously affected. Conventional heat dissipation devices, such as heat sinks, can no longer satisfy the heat dissipation requirement of the high brightness LED illuminating device.

In order to enhance heat dissipation efficiency, air moving devices such as cooling fans are employed in combination with heat sinks to dissipate the heat of the high brightness LED illuminating device. The cooling fan generates an airflow which flows through the metal fins of the heat sink, to thereby dissipate the heat of the high brightness LED illuminating device. This kind of thermal design is suitable for a majority of LED illuminating devices, but is not suitable for some LED illuminating devices which have a critical heat dissipation requirement. It is believed that the heat dissipation efficiency of the conventional heat dissipation devices can be further improved.

SUMMARY

The disclosure of the present invention relates to an LED illuminating device. According to an exemplary embodiment of the present invention, the LED illuminating device includes an optical section located at a front end of the LED illuminating device, an electrical section located at a rear end of the LED illuminating device, and a heat dissipation section located between the optical section and the electrical section. A light source is provided in the optical section. The electrical section is electrically connected with the light source. The heat dissipation section is provided with a heat dissipation device. The heat dissipation device includes a heat sink and a cooling fan. The heat sink includes a solid base and a plurality of fins extending radially and outwardly from the base. A blind hole is axially provided in the base. A plurality of air passage holes are radially defined through the base and communicate the blind hole with an outside of the base. The light source is thermally connected with the base. The cooling fan is provided over the heat sink and configured to provide an airflow towards the heat sink. A portion of the airflow flows through the fins. Another portion of the airflow flows through the blind hole and the air passage holes of the base.

Other advantages and novel features of the embodiments of the present invention will become more apparent from the following detailed description of embodiments when taken in conjunction with the accompanying drawings.

DETAILED DESCRIPTION OF THE EMBODIMENTS

Figure 1:
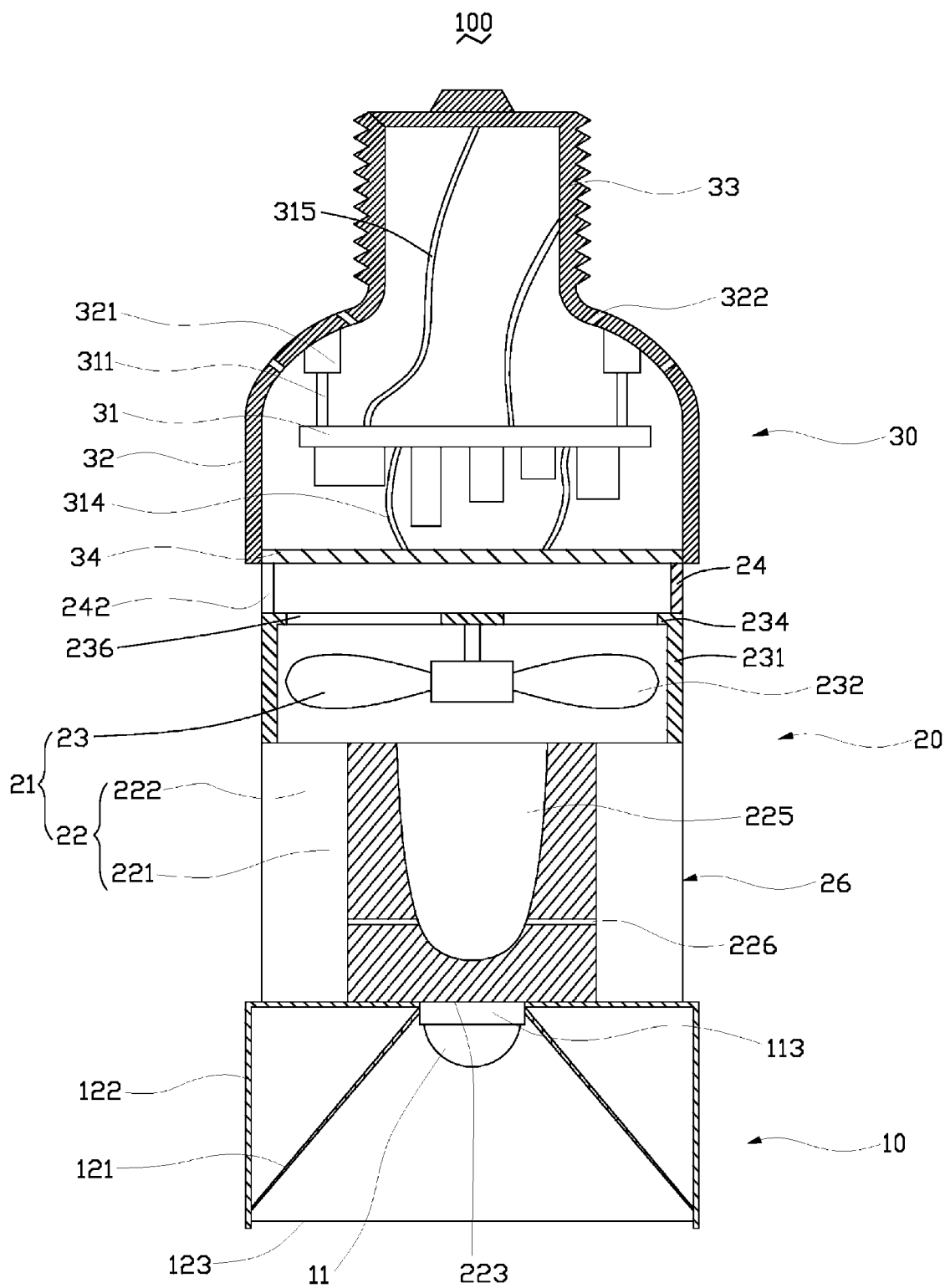
FIG. 1 is a cross-sectional view of an LED illuminating device in accordance with an embodiment of the present invention.

Reference will now be made to the drawing figures to describe the various embodiments in detail.

FIG. 1 is a cross-sectional view of an LED illuminating device 100 in accordance with an embodiment of the present invention. The LED illuminating device 100 includes an optical section 10, an electrical section 30, and a heat dissipation section 20 arranged between the optical section 10 and the electrical section 30. The LED illuminating device 100 is substantially cylindrical. The optical section 10 is located at a front end of the LED illuminating device 100, while the electrical section 30 is located at a rear end of the LED illuminating device 100.

The optical section 10 includes a housing 122, a light reflector 121, a light source 11, and an optical lens 123. A rear end of the housing 122 is coupled to the heat dissipation section 20, and a front end of the housing 122 is provided with the optical lens 123. The light reflector 121 and the light source 11 are received in the housing 122. The housing 122 provides protection for the light source 11 and the light reflector 121. The light reflector 121 is cone-shaped and tapers from the front end towards the rear end of the housing 122. The light reflector 121 has a rear end located adjacent to the heat dissipation section 20, and a front end mounted to the front end of the housing 122. The light reflector 121 and the optical lens 123 provide luminescence characteristics for the light source 11. The light source 11 is mounted at the rear end of the housing 122. Light emitted by the light source 11 is reflected and guided by the light reflector to an outside of the optical section 10 through the optical lens 123.

The electrical section 30 provides drive power, control circuit and power management for the light source 11. The electrical section 30 includes a casing 32 having a front end connected with the heat dissipation section 20, a lamp head 33 connected with a rear end of the casing 32, a mounting plate 34 mounted at the front end of the casing 32, and a circuit board 31 received in the casing 32. A plurality of air passage apertures 322 are radially defined through the casing 32 at a position adjacent to the lamp head 33. The air passage apertures 322 communicate an interior of the electrical section 30 with an environment and are utilized for dissipating heat of the circuit board 31. The circuit board 31 is mounted in the casing 32 of the electrical section 30 through a mounting mechanism which includes a socket 321 and a connecting pole 311. The socket 321 is attached to an inner surface of the casing 32. The connecting pole 311 connects the circuit board 31 with the socket 321.

The electrical section 30 is further provided with a plurality of electrical wires 314, 315 connected with the circuit board 31. The electrical wires 314 extend through the mounting plate 34 and electrically connect with the light source 11. The electrical wires 315 electrically connect with the lamp head 33, whereby the LED illuminating device 100 can get power from an external power source via the lamp head 33.

The heat dissipation section 20 is provided with a heat dissipation device 21. The heat dissipation device 21 includes a heat sink 22, and a cooling fan 23 over the heat sink 22. The heat sink 22 is located adjacent to the optical section 10. The cooling fan 23 is located between the heat sink 22 and the electrical section 30. The heat sink 22 is generally made of aluminum or aluminum alloy via an aluminum extrusion method.

Figure 2:
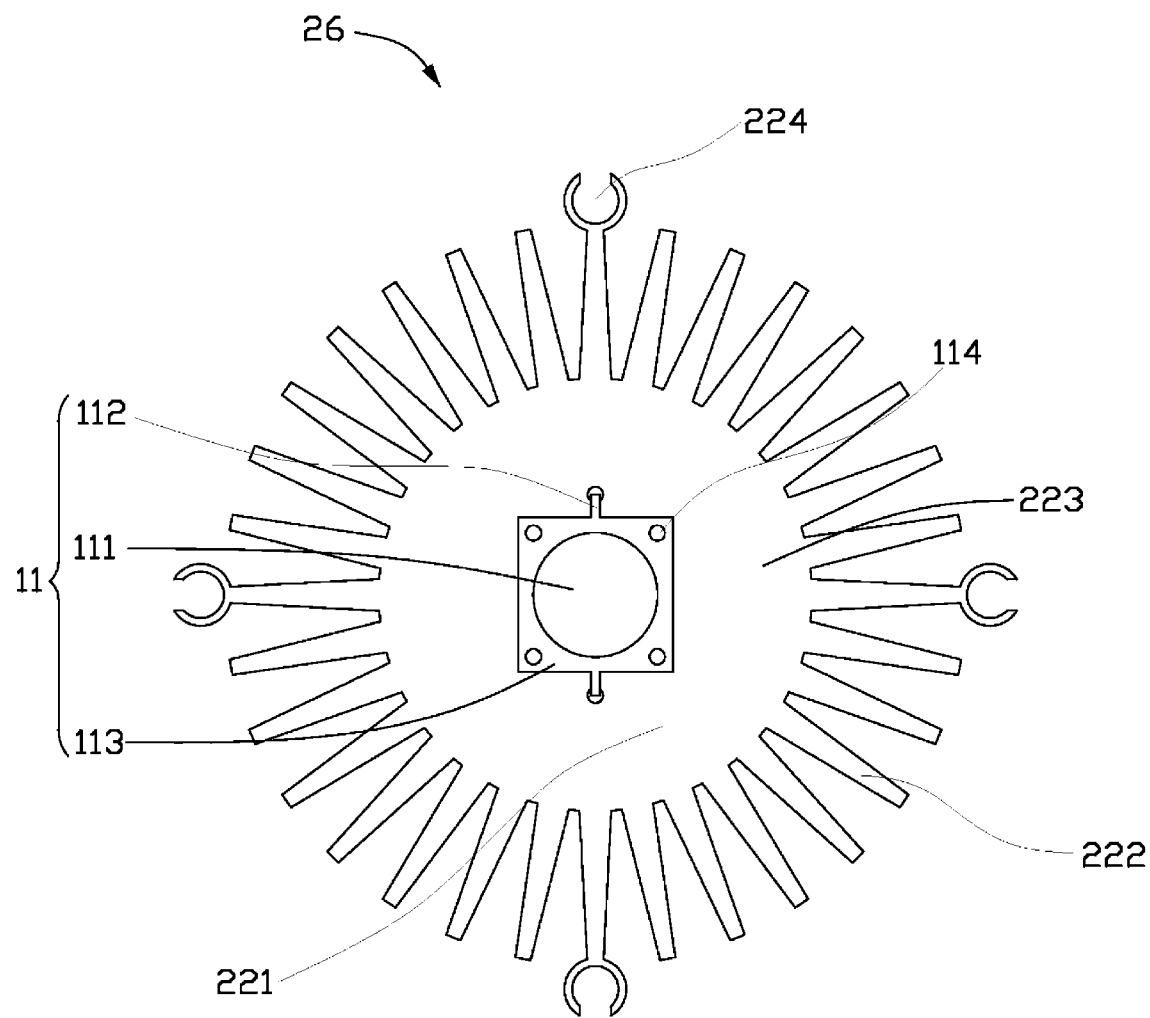
FIG. 2 is a bottom, plan view of a light engine of the LED illuminating device of FIG. 1.
Figure 3:
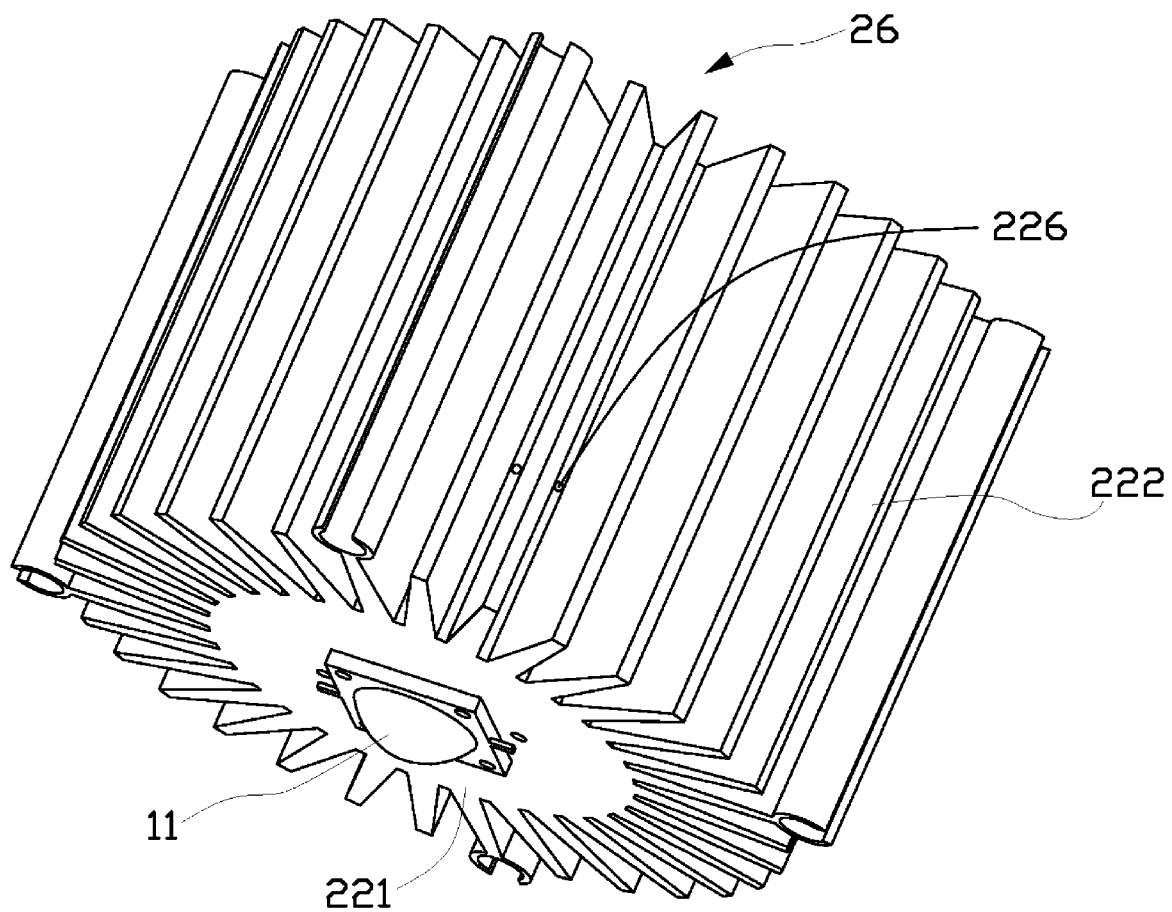
FIG. 3 is an isometric view of the light engine of FIG. 2.

The heat dissipation device 21 and the light source 11 cooperatively form a light engine 26 for the LED illuminating device 100. Referring also to FIGS. 2-3, the heat sink 22 includes a solid, column-shaped metal base 221, and a plurality of metal fins 222 extending radially and outwardly from a circumferential surface of the metal base 221. The light source 11 is attached to a bottom surface 223 of the metal base 221, whereby heat generated by the light source 11 is transferred to and effectively dissipated by the heat dissipation device 21. Some of the metal fins 222 each are provided with a mounting claw 224 at a free end thereof. Fasteners such as screws (not shown) are utilized to extend through the mounting claws 224 and threadedly engage into the housing 122, to thereby mount the heat dissipation section 20 on the housing 122 of the optical section 10.

The light source 11 includes a substrate 113 and at least an LED 111 (light emitting diode) electrically connected to the substrate 113. Four screws 114 are used to extend upwardly through the substrate 113 and threadedly engage into the bottom surface 223 of the metal base 221 to thereby securely attach the substrate 113 to the bottom surface 223 of the metal base 221. A pair of electrodes 112 are provided at opposite sides of the substrate 113 for electrically connecting the LED 111 with the electrical wires 314 of the electrical section 30. Alternatively, electrical circuits may be directly formed on the bottom surface 223 of the metal base 221, and the LED 111 is directly attached to the bottom surface 223 of the metal base 221, whereby the substrate 113 can be omitted and a heat resistance between the LED 111 and the metal base 221 is reduced.

A blind hole 225 is axially defined in the metal base 221. The blind hole 225 is recessed axially from a top portion of the metal base 221 toward a bottom portion of the metal base 221. The blind hole 225 has an open end at the top portion of the metal base 221 and a sealed end at the bottom portion of the metal base 221. The blind hole 225 has a size gradually decreased from the top portion of the metal base 221 towards the bottom portion of the metal base 221, so that the blind hole 225 has a smooth, curved inner surface.

A plurality of small-sized air passage holes 226 are radially and horizontally defined through the bottom portion of the metal base 221. The air passage holes 226 communicate the blind hole 225 with an outside of the metal base 221.

The cooling fan 23 is provided between the electrical section 30 and the heat sink 22. The cooling fan 23 includes a fan housing 231 and an impeller 232 rotatably mounted to a top plate 234 of the fan housing 231. A plurality of air passage openings 236 are defined in the top plate 234 of the fan housing 231. The heat dissipation section 20 is provided with an annular spacer 24 which is interposed between the cooling fan 23 and the mounting plate 34 of the electrical section 30. A plurality of air passage openings 242 are defined through a circumferential periphery of the spacer 24.

The cooling fan 23 can be configured to begin operation as soon as the LED 111 starts emitting light. Alternatively, the cooling fan 23 can be automatically activated to rotate when a junction temperature of the LED 111 reaches a specified temperature value after the LED 111 has worked for a particular time period, and the cooling fan 23 does not operate when the junction temperature of the LED 111 is below the specified temperature value. When the cooling fan 23 does not operate, air in the blind hole 225 is heated by the heat of the LED 111 transferred to the heat sink 22 and floats upwardly. The heated, upwardly floating air escapes to ambient atmosphere via the air passage openings 236 of the top plate 234 of the fan housing 231 and the air passage openings 242 of the spacer 24. Cooling air in the ambient atmosphere enters into the blind hole 225 via the air passage holes 226 of the metal base 221, whereby a natural air convection is circulated through the heat sink 22.

When the cooling fan 23 operates, the cooling fan 23 inhales air from the ambient atmosphere via the air passage openings 242 of the spacer 24. The inhaled air then enters into the fan housing 231 via the air passage openings 236 of the top plate 234 of the fan housing 231. An airflow is therefore generated by the cooling fan 23 and flows towards the heat sink 22. A portion of the airflow directly flows through the metal fins 222 of the heat sink 22, while another portion of the airflow flows into the blind hole 225 of the metal base 221, and further to the outside of the metal base 221 through the air passage holes 226 defined in the metal base 221, whereby a forced air convection is circulated through the heat sink 22. Due to the presence of the blind hole 225 and the air passage holes 226, the airflow can flow into the metal base 221 to thereby increase a total heat exchange surface of the heat sink 22 with the airflow. Alternatively, the cooling fan 23 can be configured so that the ambient air is inhaled into the blind hole 225 via the air passage holes 226; the ambient air is then exhausted out of the heat dissipation section 20 through the air passage openings 236 and the air passage openings 242.

Figure 4:
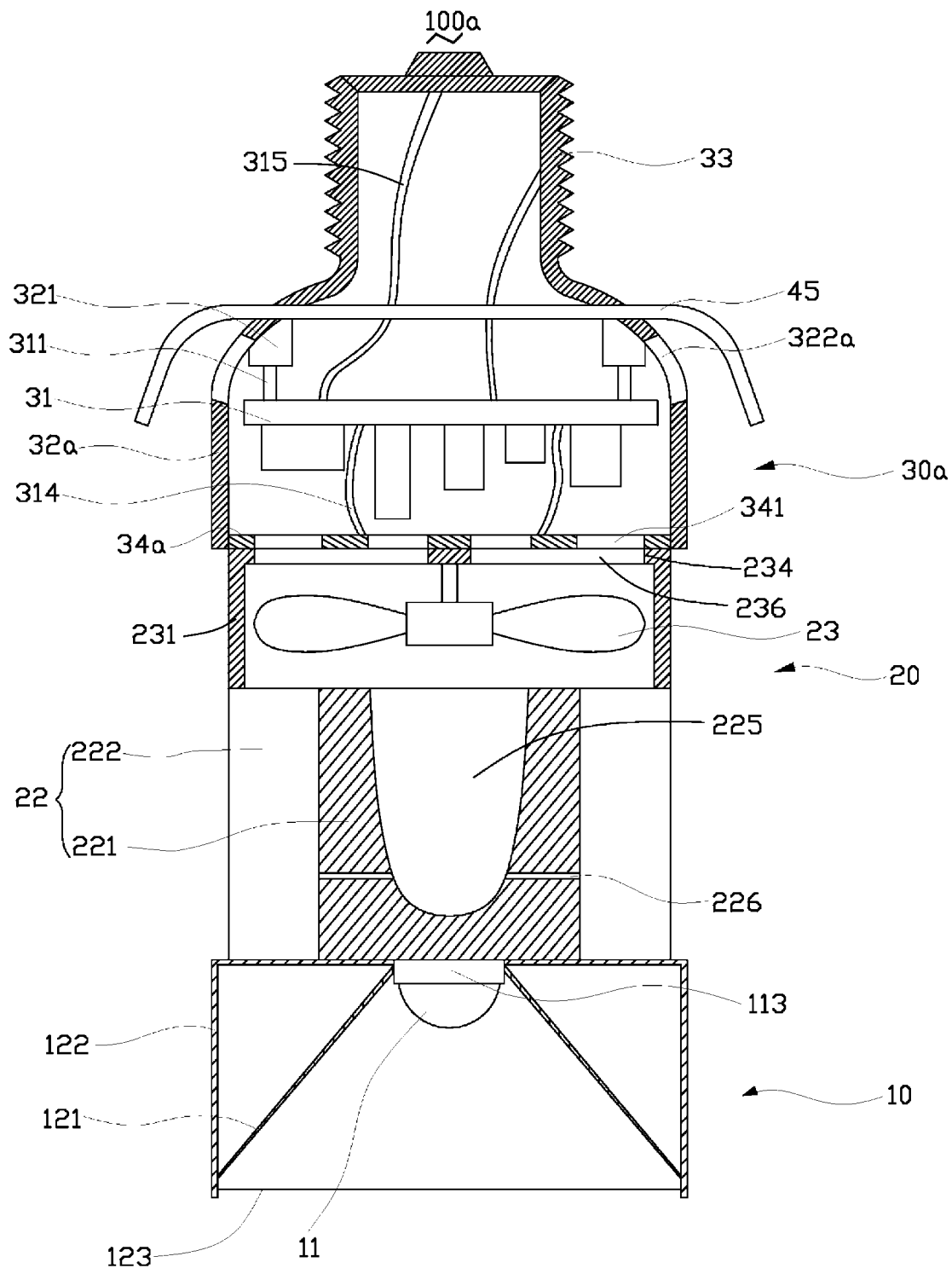
FIG. 4 is a cross-sectional view of an LED illuminating device in accordance with an alternative embodiment of the present invention.

Referring to FIG. 4, an LED illuminating device 100a according to an alternative embodiment of the present invention is illustrated. Except the following differences, the LED illuminating device 100a of the present embodiment is essentially the same as the LED illuminating device 100 of the previous embodiment. In the present embodiment, there is no spacer 24 provided between the cooling fan 23 and the mounting plate 34a of the electrical section 30a. The top plate 234 of the cooling fan 23 directly contacts with the mounting plate 34a. The mounting plate 34a is provided with a plurality of air passage openings 341. The air passage openings 341 of the mounting plate 34a communicate an interior of the fan housing 231 with an interior of the casing 32a of the electrical section 30a. A plurality of air passage apertures 322a are defined through the casing 32a at a position adjacent to the lamp head 33. The air passage apertures 322a of the casing 32a communicate an interior of the electrical section 30 with an outside environment. The air passage apertures 322a of the present embodiment each have a size larger than that of each of the air passage apertures 322 of the previous embodiment. A dustproof cover 45 is provided over the air passage apertures 322a for preventing dust from entering into the electrical section 30a.

When the cooling fan 23 does not operate, air in the blind hole 225 is heated by the heat of the LED 111 transferred to the heat sink 22 and floats upwardly. The heated, upwardly floating air from the blind hole 225 enters into the fan housing 231, and then into the electrical section 30a via the air passage openings 236 defined in the top plate 234 of the fan housing 231 and the air passage openings 341 defined in the mounting plate 34a. The floating air finally escapes to the ambient atmosphere via the air passage apertures 322a defined in the casing 32a of the electrical section 30a. Cooling air in the ambient atmosphere enters into the blind hole 225 via the air passage holes 226 defined in the metal base 221, whereby a natural air convection is circulated through the heat sink 22.

When the cooling fan 23 operates, the ambient air is inhaled into the electrical section 30a by the cooling fan 23 via the air passage apertures 322a defined in the casing 32a of the electrical section 30a. The inhaled air is then drawn by the cooling fan 23 from the electrical section 30a into the fan housing 231 via the air passage openings 341 defined in the mounting plate 34a and the air passage openings 236 defined in the top plate 234 of the fan housing 231. An airflow is therefore generated by the cooling fan 23 and flows towards the heat sink 22. A portion of the airflow directly flows through the metal fins 222 of the heat sink 22, while another portion of the airflow flows into the blind hole 225 of the metal base 221, and further to the outside of the metal base 221 through the air passage holes 226 defined in the metal base 221, whereby a forced air convection is circulated through the heat sink 22. Alternatively, the cooling fan 23 can be configured so that the ambient air is inhaled into the blind hole 225 via the air passage holes 226, the ambient air is then driven to move from the blind hole 225 into the electrical section 30a through the air passage openings 236 and the air passage openings 341, and finally the ambient air is exhausted out of the electrical section 30a through the air passage apertures 322a.

It is to be understood, however, that even though numerous characteristics and advantages of the present invention have been set forth in the foregoing description, together with details of the structure and function of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An LED illuminating device, comprising:
   an optical section located at a front end of the LED illuminating device, a light source being provided in the optical section;
   an electrical section located at a rear end of the LED illuminating device and electrically connecting with the light source; and
   a heat dissipation section located between the optical section and the electrical section, the heat dissipation section being provided with a heat dissipation device, the heat dissipation device comprising:
   a heat sink comprising a solid base and a plurality of fins extending radially and outwardly from the base, a blind hole being axially provided in the base, a plurality of air passage holes being radially defined through the base and communicating with the blind hole and an outside of the base, the light source being thermally connected with the base; and
   a cooling fan provided over the heat sink and configured to generate an airflow through the heat sink, a portion of the airflow flowing through the fins, another portion of the airflow flowing through the blind hole and the air passage holes of the base;
   wherein the blind hole extends axially from a top portion of the base toward a bottom portion of the base, the air passage holes are defined through the bottom portion of the base, the light source is thermally attached to the bottom portion of the base, and the cooling fan is located above the top portion of the base.

2. The LED illuminating device of claim 1, wherein the electrical section comprises a casing, the casing has a front end connected with the heat dissipation section and a rear end, and a mounting plate is mounted at the front end of the casing.

3. The LED illuminating device of claim 2, wherein the mounting plate seals the front end of the casing, a plurality of air passage openings are defined radially through a circumferential periphery of the heat dissipation section, and the air passage openings are located between the mounting plate and the cooling fan, the airflow generated by the fan also flowing through the air passage openings.

4. The LED illuminating device of claim 2, wherein the mounting plate is provided with a plurality of air passage openings, a plurality of air passage apertures are provided at the rear end of the casing, the airflow generated by the fan also flowing through the air passage openings and the air passage apertures.

5. The LED illuminating device of claim 4, wherein a dustproof cover is provided over the air passage apertures of the casing for preventing dust from entering into the electrical section.

6. The LED illuminating device of claim 1, wherein the electrical section comprises a casing and a circuit board received in the casing, a plurality of air passage apertures are radially defined through the casing for dissipating heat generated by the circuit board.

7. The LED illuminating device of claim 6, wherein the casing is provided with a socket and a connecting pole, the socket is attached to an inner surface of the casing, and the connecting pole connects the circuit board with the socket.

8. The LED illuminating device of claim 1, wherein the LED illuminating device is substantially cylindrical.

9. The LED illuminating device of claim 1, wherein the light source includes an LED, and the cooling fan is activated to operate when a junction temperature of the LED reaches a specified temperature value.

10. The LED illuminating device of claim 1, wherein the optical section comprises a housing, a light reflector, and an optical lens, the housing receives the light reflector and the light source therein, one end of the housing is coupled to the heat dissipation section, an opposite end of the housing is provided with the optical lens, and light emitted by the light source is reflected and guided by the light reflector to an outside of the optical section through the optical lens.

11. The LED illuminating device of claim 1, wherein the blind hole has a size gradually decreased from the top portion towards the bottom portion of the base, and the blind hole has a smooth, curved inner surface.

12. The LED illuminating device of claim 1, wherein some of the fins each are provided with a mounting claw at a free end thereof, and the mounting claw is configured to mount the heat dissipation section on the optical section.

13. A light engine of an LED illuminating device, comprising:
- a light source;
- a heat sink comprising a solid base and a plurality of fins extending radially and outwardly from the base, a blind hole being axially provided in the base, a plurality of air passage holes being radially defined through the base and communicating with the blind hole and an outside of the base, the light source being thermally connected with the base; and
- a cooling fan provided over the heat sink and configured to provide an airflow through the heat sink, a portion of the airflow flowing through the fins, another portion of the airflow flowing through the blind hole and the air passage holes of the base;

wherein the blind hole extends axially from a top portion of the base toward a bottom portion of the base, the air passage holes are defined through the bottom portion of the base, the light source is thermally attached to the bottom portion of the base, and the cooling fan is located above the top portion of the base.

\* \* \* \* \*